United States Patent
Amemiya

(10) Patent No.: US 6,249,132 B1
(45) Date of Patent: Jun. 19, 2001

(54) INSPECTION METHODS AND APPARATUSES

(75) Inventor: Hiroshi Amemiya, Yamanashi-ken (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/018,961

(22) Filed: Feb. 5, 1998

(30) Foreign Application Priority Data

Feb. 12, 1997 (JP) .................................................. 9-042981

(51) Int. Cl.⁷ .............................. G01R 31/02; G01R 1/04
(52) U.S. Cl. ...................... 324/760; 324/754; 324/158.1
(58) Field of Search ................................. 324/754, 760, 324/765, 158.1

(56) References Cited

U.S. PATENT DOCUMENTS

| | | | |
|---|---|---|---|
| 3,987,361 | * | 10/1976 | Matin, Jr. et al. ............... 324/315 |
| 4,588,092 | * | 5/1986 | Moechnig et al. ............... 324/760 |
| 4,782,291 | * | 11/1988 | Blandin ................................ 324/760 |
| 4,787,752 | * | 11/1988 | Fraser et al. ..................... 324/760 |
| 4,902,969 | * | 2/1990 | Gussman ............................ 324/760 |
| 5,097,207 | * | 3/1992 | Blanz ................................. 324/760 |
| 5,313,156 | * | 5/1994 | Klug et al. ......................... 324/760 |
| 5,397,987 | * | 3/1995 | Garritano .......................... 324/315 |
| 5,414,370 | * | 5/1995 | Hashinaga et al. ............... 324/760 |
| 5,457,398 | * | 10/1995 | Schwindt et al. ................. 324/754 |
| 5,692,556 | * | 12/1997 | Hafner ................................ 324/760 |
| 5,766,360 | * | 6/1998 | Sato et al. ......................... 118/708 |
| 5,859,540 | * | 1/1999 | Fukumoto .......................... 324/760 |
| 6,104,183 | * | 8/2000 | Kobayashi et al. ............... 324/765 |

FOREIGN PATENT DOCUMENTS

| | | |
|---|---|---|
| 60-180135 | 9/1985 | (JP) . |
| 62-54144 | 3/1987 | (JP) . |
| 63-207928 | 8/1988 | (JP) . |
| 6-323714 | 11/1994 | (JP) . |
| 7-111995 | 11/1995 | (JP) . |

* cited by examiner

Primary Examiner—Safet Metjahic
Assistant Examiner—Jermele M. Hollington
(74) Attorney, Agent, or Firm—Oblon, Spivak, McClelland, Maier & Neustadt, P.C.

(57) ABSTRACT

In the embodiment of this invention, a probe apparatus includes a loader chamber having fork for conveying the wafer, a prober chamber arranged next to the loader chamber and having a main chuck movable in the X, Y, Z, and θ directions, a partition for separating the prober chamber from the loader chamber, and a door for opening/closing the loading/unloading port of the wafer, which is formed in the partition. This probe apparatus inspects the electrical characteristics of the wafer while supplying dry air at a temperature at which moisture condensation does not occur into the prober chamber to cool the wafer through the main chuck. A heated gas spray unit sprays a heated gas onto the wafer which is moving from the prober chamber to the loader chamber through a loading/unloading port, thereby heating the wafer to a temperature higher than room temperature.

14 Claims, 4 Drawing Sheets

INSPECTION METHODS AND APPARATUSES

BACKGROUND OF THE INVENTION

The present invention relates to an inspection method and apparatus for inspecting the characteristics of an object and, more particularly, to an inspection method and apparatus for inspecting the physical characteristics, e.g., electrical characteristics of an object. In the present invention, components or finished products in various fields can be used as objects. For example, in the electronic field, the present invention can be applied to an object such as an integrated circuit formed on a semiconductor wafer, an IC chip, a printed board, or an electronic component such as an LCD.

Especially, the present invention can be applied to improve the inspection method and apparatus for inspecting the electrical characteristics of an integrated circuit formed on a semiconductor wafer (to be referred to as a wafer hereinafter).

Conventionally, an inspection method comprising the inspection step of inspecting the characteristics of an object and the unloading step of unloading the object which has undergone the inspection step, and an inspection apparatus for practicing the inspection method are used in various fields. When the inspection step is to be performed in a low-temperature environment, the surface of the object must be prevented from moisture condensation during inspection. Various techniques for this purpose, e.g., techniques of making the inspection chamber atmosphere cold and dry have been developed (Jpn. Pat. Appln. KOKAI Publication Nos. 60-180135, 62-54144, and 63-207928, and Jpn. Pat. Appln. KOKOKU Publication No. 7-111995). After inspection of the characteristics of the object in this atmosphere, the object is automatically unloaded by a convey mechanism.

The object which has undergone the inspection step is conveyed from the inspection chamber to a room-temperature environment. During or after this convey step, the object which has been cooled at the low temperature is moved to an environment at a high dew point. As a result, moisture condensation takes place on the surface of the object, so dust tends to attach to the surface. The present invention has as its object to prevent or minimize this moisture condensation to prevent or minimize dust attaching to the surface of the object.

The prior arts and their problems will be described in more detail by using a probe test apparatus in the semiconductor field.

FIGS. 5 and 6 show the conventional probe test apparatus in the semiconductor field. This probe test apparatus comprises a loader chamber 1 in which a convey mechanism for conveying and prealigning a wafer W is arranged, and a prober chamber 2 in which a means for inspecting the electrical characteristics of the wafer W conveyed from the loader chamber 1 is arranged. Fork 3 and a subchuck 4 are disposed in the loader chamber 1. While the wafer W is being conveyed by the fork 3, the subchuck 4 prealigns the wafer W with reference to the orientation flat. A main chuck 5 and an alignment mechanism 6 are disposed in the prober chamber 2. The main chuck 5 on which the wafer W has been mounted aligns the wafer W with respect to probes 7A of a probe card 7 in cooperation with the alignment mechanism 6 while moving in the X, Y, Z, and θ directions. The probes 7A electrically contact bonding pads on the wafer W and send an electrical signal from the bonding pads to a test section (not shown) through a test head T, so the test section inspects the electrical characteristics of the wafer W. The probe card 7 is detachably attached to a head plate 8 which constitutes the ceiling of the prober chamber 2.

In an apparatus having a partition 9 between the loader chamber 1 and the prober chamber 2, a loading/unloading port 9A for the wafer W is formed in the partition 9, and an opening/closing door 10 (FIG. 1) is attached to the loading/unloading port 9A. This opening/closing door 10 is kept closed during inspection and opened when the wafer W is conveyed by the fork 3 between the loader chamber 1 and the prober chamber 2.

The wafer W is inspected by room-temperature inspection, low-temperature inspection, or high-temperature inspection. For this purpose, the main chuck 5 has a temperature adjustment means. The temperature of the wafer W is set within a wide range from, e.g., –several ten ° C. to +160° C. using the temperature adjustment means. When the wafer W is to be inspected at a low temperature of –40° C., the temperature adjustment means cools the wafer W on the main chuck 5 to –40° C. In this case, dry air at a dew point of –40° C. or less is supplied to the prober chamber 2 to prevent moisture condensation and icing on the surface of the wafer W. After inspection, the fork 3 pick up the wafer W from the main chuck 5 and unload the wafer W from the prober chamber 2 to the loader chamber 1.

When the wafer is inspected at a low temperature and then unloaded from the prober chamber 2 to the loader chamber 1 in the probe apparatus, moisture condensation takes place on the wafer surface (sometimes moisture freezes to result in icing). Dust tends to attach to the wafer surface due to moisture and contaminates the surface.

This is a common problem for inspection systems which perform the step of inspecting an object in a low-temperature environment and then conveying it to an environment at a higher temperature, e.g., room temperature.

BRIEF SUMMARY OF THE INVENTION

It is an object of the present invention to solve the above problem.

According to the first aspect of the present invention, there is provided an inspection method comprising the inspection step of inspecting predetermined characteristics of an object, the inspection step including inspection at least at a temperature not more than room temperature, and the unloading step of unloading the object which has undergone the inspection step, the unloading step including heating the object to a temperature at which moisture condensation does not occur on a surface of the object during and after the unloading step.

In the present invention, the "object" includes components or finished products in various fields. In, e.g., the electronic field, an integrated circuit formed on a semiconductor wafer, an IC chip, a printed board, or an electronic device such as an LCD can be exemplified as the object.

In the present invention, "inspection at least at a temperature not more than room temperature" includes, in addition to inspection at room temperature or less, a combination of inspection at room temperature or less and inspection at another temperature, e.g., a combination of inspection at room temperature or less and inspection at room temperature, or a combination of inspection at room temperature or less and inspection of room temperature or more.

In the present invention, the means for the "process of heating the object" can be selected from heating means using radiation heat from electric heating, heating means for spraying a gas (e.g., air) heated using electric heating or a vortex tube, and the like, in accordance with the nature of the object or desired heating speed.

The heating means can be set operative not only during the unloading step but also throughout the loading step, the inspection step, and the unloading step.

The timing of this process can also be set at any stage of the unloading step, or throughout the unloading step. When the unloading step is performed in the same environment as that in the inspection chamber, the heating step may be performed immediately after the unloading step.

According to the second aspect of the present invention, in the method of the first aspect, the heating step includes spraying a gas heated to a predetermined temperature to the object which has undergone the inspection step.

In the present invention, the "gas" used in the heating step can be selected from air, an inert gas, and the like in accordance with the nature of the object.

According to the third aspect of the present invention, in the method of the first aspect, the heating step includes spraying air heated to a predetermined temperature to the object which has undergone the inspection step (including "during and after the unloading step") (including a combination with another step).

According to the fourth aspect of the present invention, there is provided an inspection method comprising the inspection step of inspecting electrical characteristics of integrated circuits formed on a semiconductor wafer, the inspection step including at least inspection at a temperature not more than room temperature, and the unloading step of unloading the semiconductor wafer which has undergone the inspection step, the unloading step including heating the semiconductor wafer to a temperature at which moisture condensation does not occur on a surface of the semiconductor wafer during and after the unloading step.

According to the fifth aspect of the present invention, in the method of the fourth aspect, the heating step includes spraying a gas heated to a predetermined temperature to the semiconductor wafer which has undergone the inspection step.

According to the sixth aspect of the present invention, in the method of the fourth aspect, the heating step includes spraying air heated to a predetermined temperature to the semiconductor wafer which has undergone the inspection step.

According to the seventh aspect of the present invention, there is provided an inspection apparatus comprising an inspection chamber having inspection means for inspecting predetermined characteristics of an object and temperature control means for controlling a temperature of the object during inspection, in which the object is inspected at least at a temperature not more than room temperature, a convey mechanism for conveying the object, and heating means for heating the object during a process of unloading the object from the inspection chamber by the convey mechanism, the heating means heating the object to a temperature at which moisture condensation does not occur on a surface of the object during and after the process of unloading the object.

In the present invention, as the "temperature control means", a technique of incorporating a cooling or heating means in a table on which the object is to be mounted, a technique of cooling or heating the atmosphere in the inspection chamber, or a combination of these techniques can be employed.

According to the eighth aspect of the present invention, in the apparatus of the seventh aspect, the heating means comprises means having a mechanism having a spray port for spraying a gas heated to a predetermined temperature to the object.

According to the ninth aspect of the present invention, in the apparatus of the seventh aspect, the heating means comprises means having a mechanism having a spray port for spraying air heated to a predetermined temperature to the object.

According to the 10th aspect of the present invention, in the apparatus of the ninth aspect, the inspection chamber comprises an inlet/outlet for loading/unloading the object by the convey mechanism, and an opening/closing door for opening/closing the inlet/outlet, and the opening/closing door has the spray port of the heating means.

In the present invention, the "opening/closing door" can be a door which is opened/closed upon rotating about a hinge. The door may be a mechanism which rotates to the inspection chamber side or the unloading side.

According to the 11th aspect of the present invention, there is provided an inspection apparatus comprising an inspection chamber having inspection means for inspecting electrical characteristics of integrated circuits formed on a semiconductor wafer and temperature control means for controlling a temperature of the semiconductor wafer during inspection, in which the semiconductor wafer is inspected at least at a temperature not more than room temperature, a convey mechanism for conveying the semiconductor wafer, and heating means for heating the semiconductor wafer during a process of unloading the semiconductor wafer from the inspection chamber by the convey mechanism, the heating means heating the semiconductor wafer to a temperature at which moisture condensation does not occur on a surface of the semiconductor wafer during and after the process of unloading the semiconductor wafer.

According to the 12th aspect of the present invention, in the apparatus of the 11th aspect, the heating means comprises means having a mechanism having a spray port for spraying a gas heated to a predetermined temperature to the semiconductor wafer.

According to the 13th aspect of the present invention, in the apparatus of the 11th aspect, the heating means comprises means having a mechanism having a spray port for spraying air heated to a predetermined temperature to the semiconductor wafer.

According to the 14th aspect of the present invention, in the apparatus of the 13th aspect, the inspection chamber comprises an inlet/outlet for loading/unloading the semiconductor wafer by the convey mechanism, and an opening/closing door for opening/closing the inlet/outlet, and the opening/closing door has the spray port of the heating means.

Additional object and advantages of the invention will be set forth in the description which follows, and in part will be obvious from the description, or may be learned by practice of the invention. The object and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

The present invention relates to an inspection method comprising the inspection step of inspecting the characteristics of an object and the unloading step of unloading the object which has undergone the inspection step, and an inspection apparatus for practicing the inspection method.

The present invention can be applied to inspection methods and apparatuses in various technical fields. Especially, the present invention can be applied to improve an inspection method and apparatus for inspecting (e.g., probe test) the electrical characteristics of an integrated circuit formed on a semiconductor wafer (to be referred to as a wafer hereinafter) as an object.

The present invention will be described below on the basis of an embodiment in which the present invention is applied to a semiconductor wafer inspection apparatus (probe test apparatus) with reference to FIGS. 1 to 4B.

Figure 1:
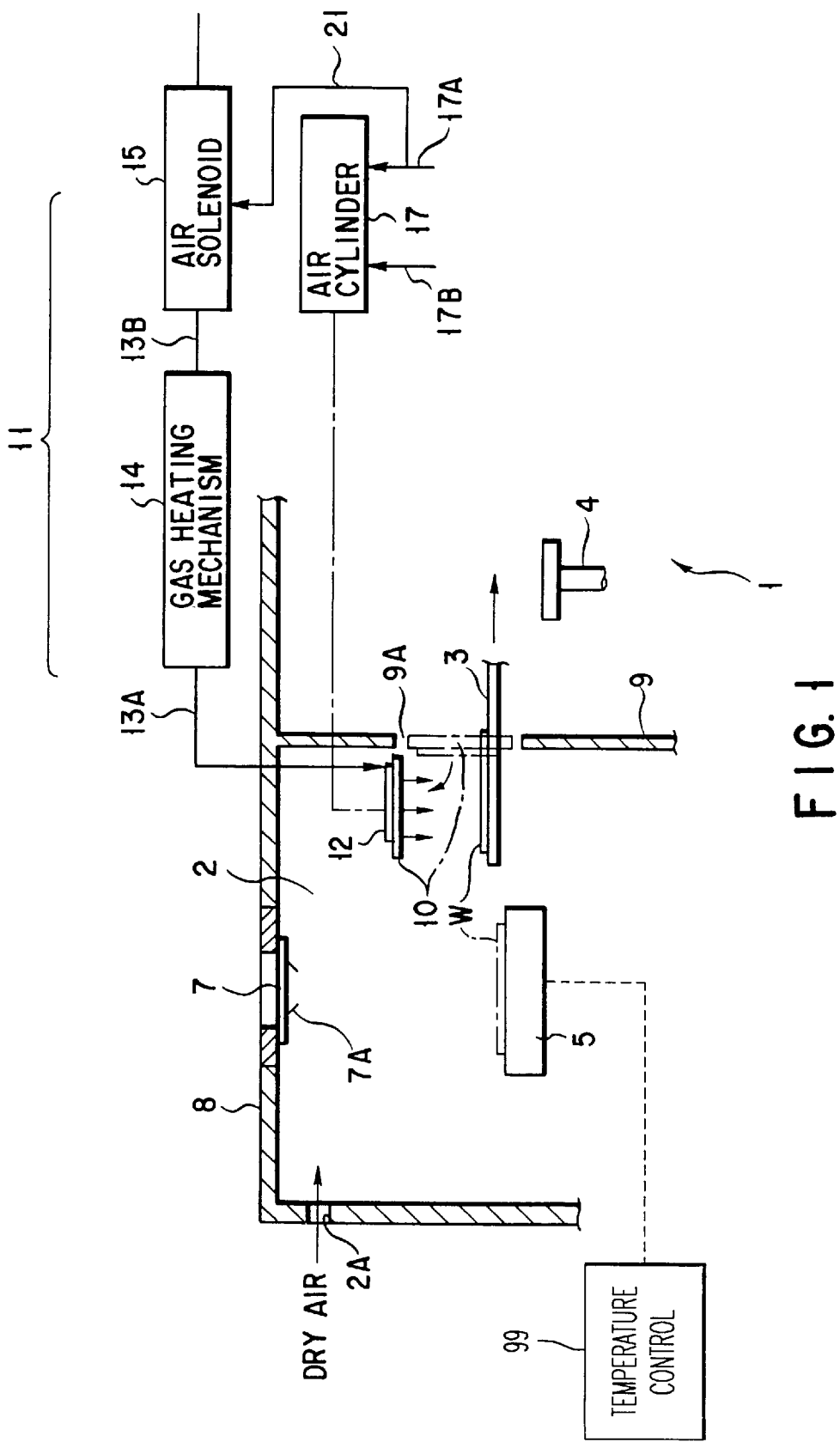
FIG. 1 is a view showing the arrangement of an embodiment in which the present invention is applied to inspection of a semiconductor wafer.

As shown in FIG. 1, the probe test apparatus comprises a loader chamber 1, a prober chamber 2, fork 3, a subchuck 4, a main chuck 5, an alignment mechanism (not shown), and a probe card 7. The prober chamber 2 is a section for performing the inspection step. The fork 3 constitute part of the convey mechanism for performing the load/unloading step. The loader chamber 1 and the prober chamber 2 may be integrated into one chamber. However, in the apparatus shown in FIG. 1, the loader chamber 1 and the prober chamber 2 are separated by a partition 9. The partition 9 has a loading/unloading port 9A which is opened/closed by an opening/closing door 10.

The prober chamber 2 has a supply port 2A for receiving/supplying dry air, and a pipe (not shown) for supplying dry air to the supply port 2A is connected to the prober chamber 2. Dry air at a dew point of, e.g., −70° C. is supplied from this port into the prober chamber 2 and exhausted through an exhaust port (not shown) such that the dew point of air in the prober chamber 2 is held at −70° C., and the interior of the prober chamber 2 is always kept clean. The main chuck 5 has a temperature adjustment mechanism or temperature controller means 99. With the temperature adjustment mechanism, a wafer W mounted on the main chuck 5 can be inspected at a low temperature of, e.g., about −60° C. The wafer W mounted on the main chuck can also be heated by the temperature adjustment mechanism and inspected at about +160° C.

The probe apparatus of this embodiment has a heated gas spray unit 11 as a heating means for heating the object. The heated gas spray unit 11 sprays a heated gas (e.g., air) to the wafer W which is passing through the loading/unloading port 9A when the opening/closing door 10 is opened. The heated gas spray unit 11 comprises a heated gas injection mechanism 12 incorporated in the opening/closing door (to be referred to as the "door" hereinafter) 10, a gas heating mechanism 14 connected to the heated gas injection mechanism 12 through a pipe 13A, and a solenoid valve 15 connected to the gas heating mechanism 14 through a pipe 13B. As the gas heating mechanism 14, a heating means such as an electric heater or a vortex tube can be employed. The vortex tube is a known mechanism which can generate a high-temperature gas of about 80° C. and a low-temperature gas of about −30° C. from a high-pressure gas (air) of, e.g., about 30° C. The solenoid valve 15 is opened in synchronism with the opening operation of the door 10 to supply a gas at a predetermined pressure to the gas heating mechanism 14.

Figure 2:
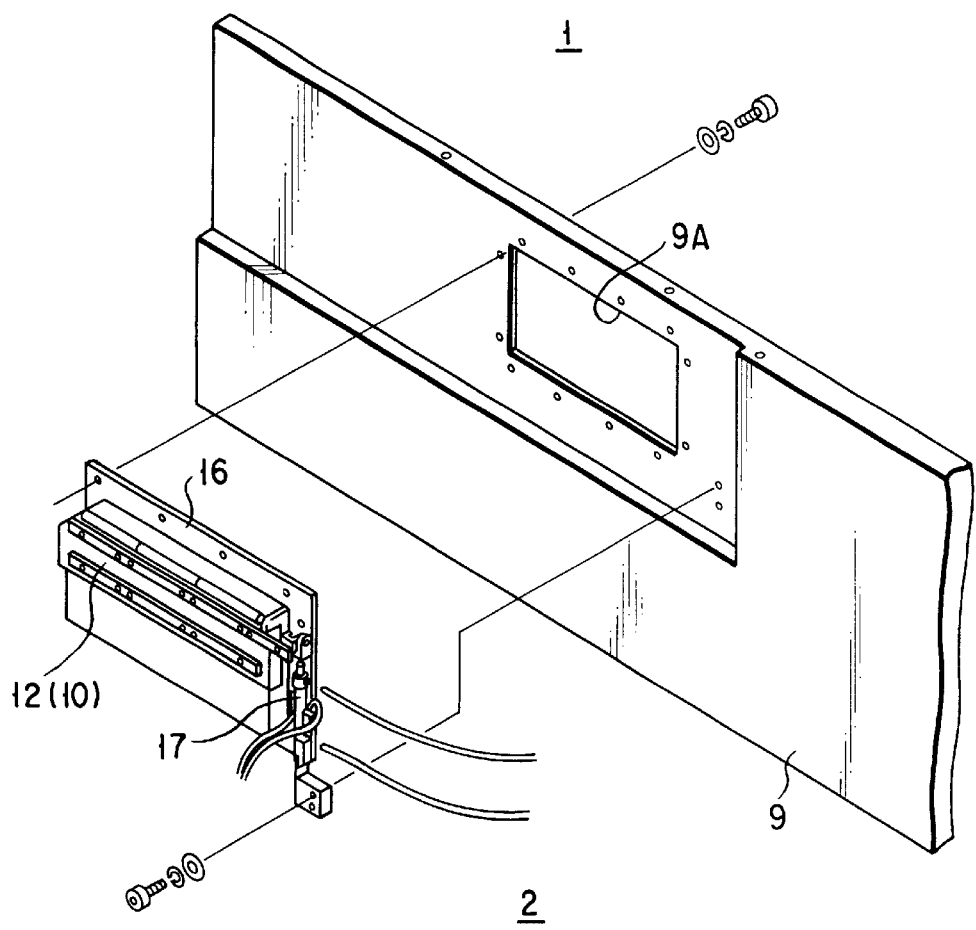
FIG. 2 is an exploded perspective view showing a state in which a heated gas injection mechanism of a heated gas spray unit shown in FIG. 1 is attached to a partition.
Figure 3:
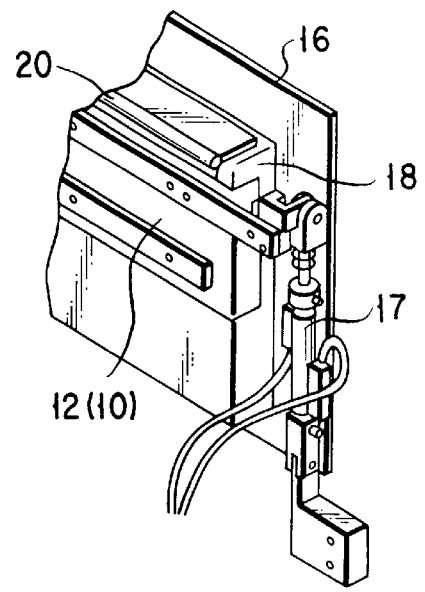
FIG. 3 is an enlarged perspective view of an air cylinder shown in FIG. 2.
Figures 4A, 4B:
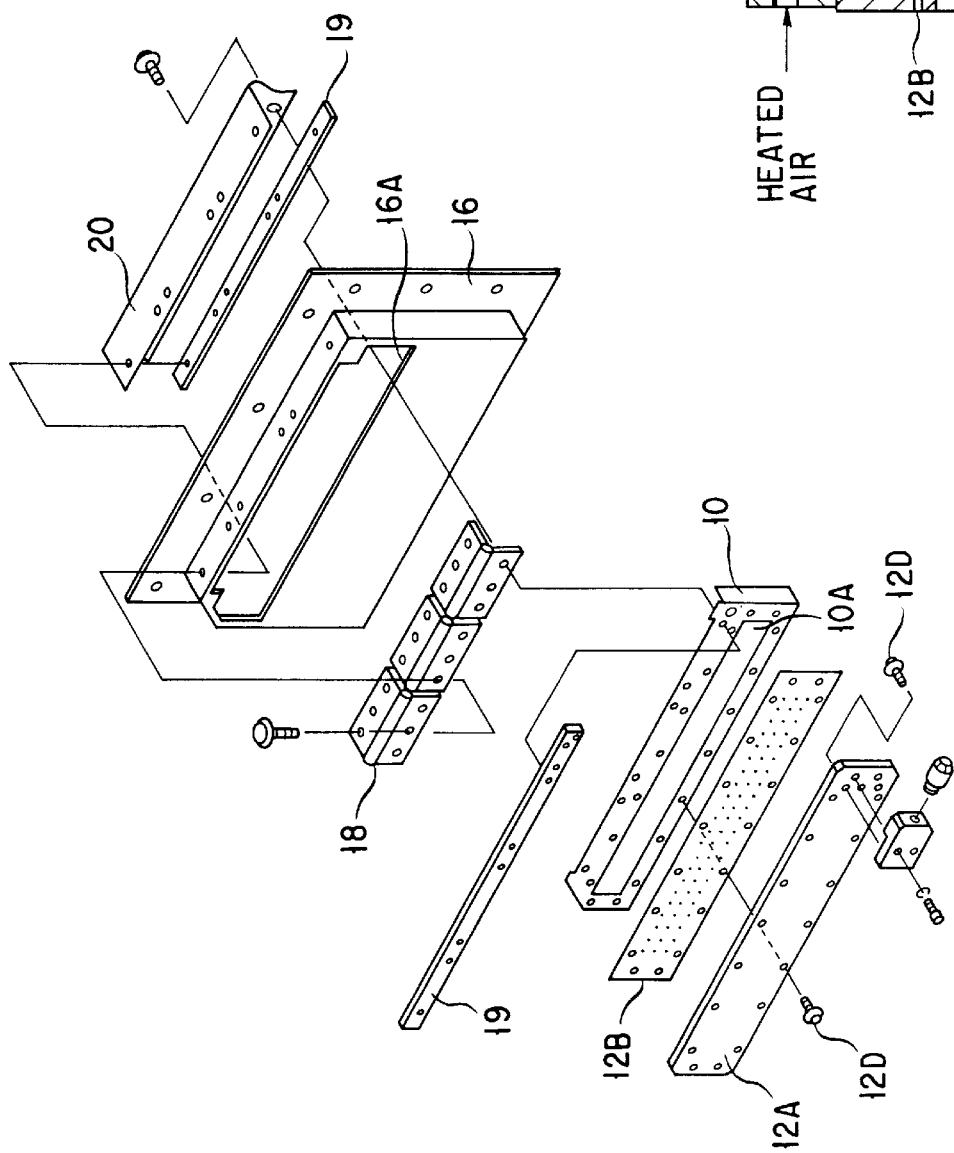
FIG. 4A is an exploded perspective view of the heated gas injection mechanism and an opening/closing door shown in FIG. 2.
FIG. 4B is a partial sectional view of the heated gas injection mechanism shown in FIG. 2.
Figure 5:
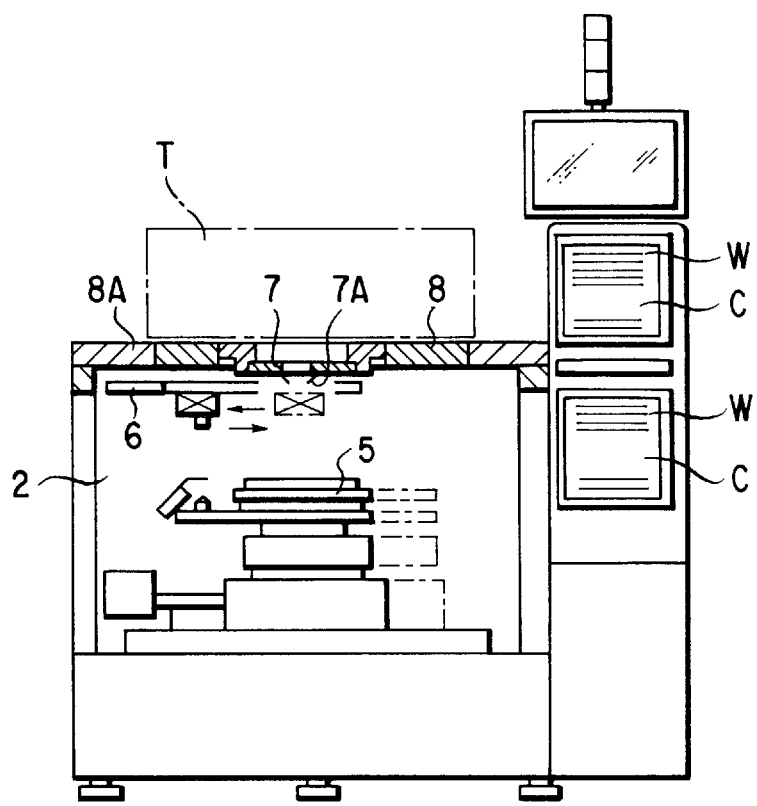
FIG. 5 is a partially sectional view of a prober chamber in a conventional probe apparatus used to inspect a semiconductor wafer.
Figure 6:
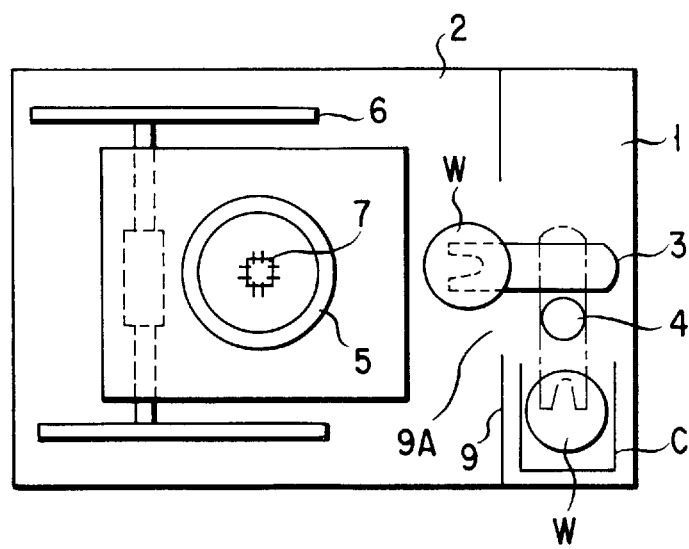
FIG. 6 is a view showing the internal arrangement of the probe apparatus shown in FIG. 5.

As shown in FIGS. 2 and 3, the door 10 and the heated gas injection mechanism 12 are attached to the loading/unloading port 9A of the partition 9 via a frame 16. The door 10 and the heated gas injection mechanism 12 are turned by an adjacent air cylinder 17 to open/close the loading/unloading port 9A. FIG. 4A is an exploded perspective view of the door 10 and the heated gas injection mechanism 12. The heated gas injection mechanism 12 comprises a low-profile rectangular box 12A having a full opening on the loader chamber 1 side, a nozzle plate 12B attached to the opening of the box 12A, and a connection component 12C for connecting the pipe 13A to the box 12A. The box 12A, the nozzle plate 12B, and the door 10 are combined in this order and integrated with screws 12D at their peripheral portions, so a small space 12E is formed in the box 12A, as shown in FIG. 4B. The nozzle plate 12B has nozzle holes which are uniformly formed almost over the surface of the nozzle plate 12B. A heated gas is injected from these nozzle holes. The door 10 has an opening portion 10A such that the nozzle holes are not closed by the door 10. The heated gas injection mechanism 12 is integrated with the door 10. When the door 10 of the loading/unloading port 9A is opened, the heated gas injection mechanism 12 injects a heated gas downward. When the heated gas is supplied from the pipe 13A to the heated gas injection mechanism 12, the heated gas flows into the space 12E in the box 12A through the connection component 12C and is uniformly injected from the nozzle holes of the nozzle plate 12B.

The frame 16 has a rectangular recessed portion 16A projecting toward the prober chamber 2 side. The door 10 integrated with the heated gas injection mechanism 12 is connected to the recessed portion 16A by a plurality of hinges 18 to be freely opened/closed. The door 10 rotates about the hinges 18 through almost 90° from the loading/unloading port 9A to the prober chamber 2 side and stops at the horizontal position. In FIG. 4A, reference numeral 19 denotes a hinge stopper; and 20, a Mylar.

As shown in FIG. 1, an air pipe 21 is connected to the solenoid valve 15 of the heated gas spray unit 11 and the air cylinder 17. More specifically, the air cylinder 17 has a first pipe 17A for supplying compressed air to open the door 10, and a second pipe 17B for supplying compressed air to close the door 10. The air pipe 21 branches from the first pipe 17A. To open the door 10, compressed air is also supplied from the air pipe 21 to the solenoid valve 15, so the solenoid valve 15 is driven by the pressure of the compressed air. The valve is opened to supply high-pressure air to the gas heating mechanism 14. The heated gas is injected from the heated gas injection mechanism 12 immediately downward and sprayed to the object, so the object heating step is performed.

The operation will be described next. In the loader chamber 1, the fork 3 pick up one 12-inch wafer W from the cassette. The wafer W is prealigned on the subchuck 4 and loaded into the prober chamber 2. At this time, the air cylinder 17 is driven to open the door 10 on the basis of the sequential control of a controller, so the loading/unloading port 9A of the partition 9 is opened. The heated gas is injected downward from the heated gas injection mechanism 12. The wafer W is quickly loaded through the loading/unloading port 9A into the prober chamber 2 by the fork 3 such that the wafer W is prevented from being heated by the heated gas. The wafer W passes immediately under the door 10 in about two seconds and is mounted on the main chuck 5. The fork 3 are retracted from the prober chamber 2 and wait in the loader chamber 1 for unloading of the inspected wafer W. The air cylinder 17 drives the door 10 to close the door 10, so the loading/unloading port 9A is closed.

In the prober chamber 2, dry air at a dew point of −70° C. is continuously supplied from the supply port 2A and exhausted through the exhaust port. For this reason, air in the prober chamber 2 is always held at that dew point, and no particles remain in the prober chamber 2, so the interior is kept in a clean state. Under this environment, the main chuck 5 holds the wafer W loaded by the fork 3 by vacuum suction. The wafer W is cooled to, e.g., −60° C., moved in the X, Y, Z, and θ directions by the alignment mechanism (not shown), and aligned with probes 7A. The main chuck 5 is elevated in the Z direction to bring electrode pads on the wafer into contact with the probes 7A, so the wafer W is inspected at a low temperature of −60° C. After inspection, the main chuck 5 is moved downward in the Z direction. The main chuck 5 is indexed and elevated in the Z direction. This inspection step is repeated to inspect all IC chips on the wafer W.

After all IC chips are inspected, the main chuck 5 moves to the unloading position of the wafer W and stops. In synchronism with this operation, compressed air is supplied from the first pipe 17A to the air cylinder 17. The air cylinder 17 drives the door 10 to open the door 10, so the loading/unloading port 9A is opened. Compressed air is supplied to the solenoid valve 15 through the air pipe 21 branching from the first pipe 17A. The valve 15 is opened, so air heated to, e.g., 80° C. by the gas heating mechanism 14 is supplied to the heated gas injection mechanism 12. In the heated gas injection mechanism 12, the heated air flows into the space 12E in the box 12A and is injected immediately downward from the nozzle holes of the nozzle plate 12B.

When the gas heated to 80° C. is being injected from the heated gas injection mechanism 12, the fork 3 move from the loader chamber 1 to the prober chamber 2 to unload the low-temperature wafer W on the main chuck 5 to the loader chamber 1 at room temperature. In this unloading step, since air at a high dew point flows into the prober chamber 2 through the loading/unloading port 9A, the dew point in the prober chamber 2 considerably rises. The low-temperature wafer W is loaded into the loader chamber 1 at a high dew point. If the temperature of the wafer W is kept low, moisture condensation takes place on the wafer surface contacting air at the high dew point. The moisture freezes to result in white frost on the wafer W. However, in the present invention, the wafer W is loaded into the loader chamber 1 while passing immediately under the heated gas injection mechanism 12 at a considerably low speed (e.g., about 13 seconds), and during this time, the heated gas is sprayed from the heated gas injection mechanism onto the wafer W. Even when moisture condensation has already occurred on the wafer W, the moisture evaporates and/or scatters upon spraying the heated gas, so the moisture can be removed. In addition, the wafer W is heated to room temperature or more by spraying the heated gas. For this reason, even when the wafer W is unloaded to the loader chamber 1 and comes into contact with air having the high dew point in the loader chamber 1, moisture condensation on the surface can be prevented.

As has been described above, according to this embodiment, the wafer W can be unloaded from the prober chamber 2 to the loader chamber 1 while preventing moisture condensation on the surface of the wafer W. For this reason, the wafer W can be prevented from being contaminated by dust in the loader chamber 1.

In the above embodiment, the solenoid valve 15 is used as a valve inserted into the air supply path. However, a motorized valve may also be used.

According to the present invention, an inspection method and apparatus which prevent moisture condensation on an object having a large diameter of, e.g., 12 inches after it is inspected at a low temperature, thereby reliably preventing the object from being contaminated can be provided.

The present invention can prevent or minimize moisture condensation even in a probe test of a wafer having a large diameter of, e.g., 12 inches, thereby preventing the wafer from being contaminated.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalent.

What is claimed is:

1. An inspection method comprising:

the inspection step of inspecting predetermined characteristics of a semiconductor wafer, the inspection step including at least inspection in a first environment which is at a first temperature; and the unloading step of unloading said a semiconductor wafer which has undergone the inspection step, the unloading step including heating said semiconductor wafer to a temperature at which moisture condensation does not occur on a surface of said semiconductor wafer during transfer of said object from said first environment to a second environment which is at a second temperature greater than said first temperatures wherein said step of heating said semiconductor wafer includes spraying a heated gas of a predetermined temperature to said semiconductor wafer subjected to the inspection step at a loading/unloading port of an inspection chamber.

2. A method according to claim 1, wherein the step of spraying a heated gas includes spraying heated air of a predetermined temperature to said semiconductor wafer.

3. An inspection method comprising:

the inspection step of inspecting electrical characteristics of integrated circuits formed on a semiconductor wafer, the inspection step including at least inspection in a first environment which is at a first temperature; and the unloading step of unloading said semiconductor wafer which has undergone the inspection step, the unloading step including heating said semiconductor wafer to a temperature at which moisture condensation does not occur on a surface of said semiconductor wafer during transfer of said object from said first environment to a second environment which is at second temperature greater than said first temperature, wherein said step of heating said semiconductor wafer includes spraying a heated gas of a predetermined temperature to said semiconductor wafer subjected to the inspection step at a loading/unloading port of an inspection chamber.

4. A method according to claim 3, wherein the step of spraying a heated gas includes spraying heated air of a predetermined temperature to said semiconductor wafer.

5. An inspection apparatus comprising:

an inspection chamber having inspection means for inspecting predetermined characteristics of a semiconductor wafer and temperature control means for controlling a temperature of said semiconductor wafer during inspection, in which said semiconductor wafer is at least inspected at a first temperature;

a convey mechanism configured to convey said semiconductor wafer; and heating means for heating said semiconductor wafer during a process of unloading said semiconductor wafer from said inspection chamber into an environment having a second temperature higher than said first temperature by said convey mechanism, said heating means heating said semiconductor wafer to a temperature at which moisture condensation does not occur on a surface of said semiconductor wafer during the process of unloading said semiconductor wafer, wherein said heating means includes means for spraying a heated gas of a predetermined temperature to said semiconductor wafer subjected to the inspection step at a loading/unloading port of said inspection chamber.

6. An apparatus according to claim 5, wherein said means for spraying a heated gas comprises means for spraying heated air of a predetermined temperature to said semiconductor wafer.

7. An inspection apparatus comprising:

an inspection chamber having inspection means for inspecting predetermined characteristics of a semiconductor wafer and temperature control means for controlling a temperature of said semiconductor wafer during inspection, in which said semiconductor wafer is at least inspected at a first temperature;

a convey mechanism configured to convey said semiconductor wafer; and heating means for heating said semiconductor wafer during a process of unloading said semiconductor wafer from said inspection chamber into an environment having a second temperature higher than said first temperature by said convey mechanism, said heating means heating said semiconductor wafer to a temperature at which moisture condensation does not occur on a surface of said semiconductor wafer during the process of unloading said semiconductor wafer, wherein said heating means includes means for spraying at least one of heated air and heated gas of a predetermined temperature to said semiconductor wafer subjected to the inspection step at a loading/unloading port of said inspection chamber, wherein said loading/unloading port of said inspection chamber comprises an inlet/outlet port for loading/unloading said semiconductor wafer by said convey mechanism, and an opening/closing door for opening/closing the inlet/outlet port, and wherein said opening/closing door includes said means for spraying.

8. An inspection apparatus comprising:

an inspection chamber having inspection means for inspecting electrical characteristics of integrated circuits formed on a semiconductor wafer and temperature control means for controlling a temperature of said semiconductor wafer during inspection, in which said semiconductor wafer is at least inspected at a first temperature;

a convey mechanism configured to convey said semiconductor wafer; and heating means for heating said semiconductor wafer during a process of unloading said semiconductor wafer from said inspection chamber into an environment having a second temperature higher than said first temperature by said convey mechanism, said heating means heating said semiconductor wafer to a temperature at which moisture condensation does not occur on a surface of said semiconductor wafer during the process of unloading said semiconductor wafer, wherein said heating means includes means for spraying a heated gas of a predetermined temperature to said semiconductor wafer subjected to the inspection step at a loading/unloading port of said inspection chamber.

9. An apparatus according to claim 8, wherein said means for spraying a heated gas comprises means for spraying heated air of a predetermined temperature to said semiconductor wafer.

10. An inspection apparatus comprising:

an inspection chamber having inspection means for inspecting electrical characteristics of integrated circuits formed on a semiconductor wafer and temperature control means for controlling a temperature of said semiconductor wafer during inspection, in which said semiconductor wafer is at least inspected at a first temperature;

a convey mechanism configured to convey said semiconductor wafer; and heating means for heating said semiconductor wafer during a process of unloading said semiconductor wafer from said inspection chamber into an environment having a second temperature higher than said first temperature by said convey mechanism, said heating means heating said semiconductor wafer to a temperature at which moisture condensation does not occur on a surface of said semiconductor wafer during the process of unloading said semiconductor wafer, wherein said heating means includes means for spraying at least one of heated air and heated gas of a predetermined temperature to said semiconductor wafer subjected to the inspection step at a loading/unloading port of said inspection chamber, wherein said loading/unloading port of said inspection chamber comprises an inlet/outlet port for loading/unloading said semiconductor wafer by said convey mechanism, and an opening/closing door for opening/closing the inlet/outlet port, and wherein said opening/closing door includes said means for spraying.

11. A method as claimed in claim 1, wherein said first temperature is a temperature less tham room temperature and said second temperature is room temperature.

12. A method as claimed in claim 3, wherein said first temperature is a temperature less than room temperature and said second temperature is room temperature.

13. An apparatus as claimed in claim 5, wherein said first temperature is a temperature less than room temperature and said second temperature is room temperature.

14. An apparatus as claimed in claim 8, wherein said first temperature is a temperature less than room temperature and said second temperature is room temperature.

* * * * *